United States Patent
Takagi et al.

(10) Patent No.: US 11,116,118 B2
(45) Date of Patent: Sep. 7, 2021

(54) TAPE FEEDER SET-UP SYSTEM

(71) Applicant: FUJI CORPORATION, Chiryu (JP)

(72) Inventors: Takanori Takagi, Okazaki (JP);
Takayuki Mizuno, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 16/468,572

(22) PCT Filed: Dec. 12, 2016

(86) PCT No.: PCT/JP2016/086856
§ 371 (c)(1),
(2) Date: Jun. 11, 2019

(87) PCT Pub. No.: WO2018/109793
PCT Pub. Date: Jun. 21, 2018

(65) Prior Publication Data
US 2019/0307033 A1    Oct. 3, 2019

(51) Int. Cl.
*H05K 13/02* (2006.01)
*H05K 13/04* (2006.01)
(Continued)

(52) U.S. Cl.
CPC ............ *H05K 13/02* (2013.01); *B65H 16/02* (2013.01); *B65H 16/103* (2013.01); *H05K 13/0419* (2018.08)

(58) Field of Classification Search
CPC .... H05K 13/02; H05K 13/0419; H05K 13/08; H05K 13/084; H05K 13/085;
(Continued)

(56) References Cited

U.S. PATENT DOCUMENTS

2013/0326867 A1* 12/2013 Uesugi ............... H05K 13/0419
29/705
2015/0212519 A1* 7/2015 Sumi ................. H05K 13/0215
700/115
(Continued)

FOREIGN PATENT DOCUMENTS

GB          2 298 085 A     8/1996
JP        2000-261191 A     9/2000
(Continued)

OTHER PUBLICATIONS

International Search Report dated Mar. 14, 2017 in PCT/JP2016/086856 filed Dec. 12, 2016.

*Primary Examiner* — George R Koch
(74) *Attorney, Agent, or Firm* — Oblon, McClelland, Maier & Neustadt, L.L.P.

(57) ABSTRACT

The tape feeder set-up system has a tape feeder, having an electric motor, for feeding a carrier tape wound on a reel and accommodating multiple components in a predetermined feed direction; a loading table on which the tape feeder can be loaded; a scheduled use determination section for determining whether a component in the tape feeder loaded on the loading table is scheduled to be used based on a component usage schedule, and a control section for reversing the carrier tape in a direction opposite to the predetermined feed direction by controlling the electric motor of the tape feeder when the scheduled use determination section determines that the component is not scheduled to be used.

9 Claims, 6 Drawing Sheets

(51) Int. Cl.
*B65H 16/02* (2006.01)
*B65H 16/10* (2006.01)

(58) Field of Classification Search
CPC ............. H05K 13/0857; H05K 13/086; H05K 13/0882; B65H 16/02; B65H 16/103
See application file for complete search history.

(56) References Cited

U.S. PATENT DOCUMENTS

2016/0231727 A1  8/2016  Sagara
2017/0297848 A1* 10/2017  Goto .................. H05K 13/0408

FOREIGN PATENT DOCUMENTS

| JP | 2011-199095 A | 10/2011 |
| JP | 2013-254895 A | 12/2013 |
| WO | WO 2016/038668 A1 | 3/2016 |

* cited by examiner

| LOADING TABLE ID | FEEDER ID | REEL ID |
|---|---|---|
| D001 | F011 | R101 |
| D002 | F012 | R102 |
| D003 | F013 | R103 |

TAPE FEEDER SET-UP SYSTEM

This application is a 371 of PCT/JP2016/086856, filed on Dec. 12, 2016.

TECHNICAL FIELD

The present application relates to a tape feeder set-up system.

BACKGROUND ART

A component mounting device capable of detachably holding a tape feeder for supplying a component is known as a conventional device for mounting a component such as an electronic component on a board. The tape feeder has a driving mechanism having a driving motor for feeding a carrier tape, being wound on a rotatably-supported reel, in a predetermined feeding direction. The carrier tape accommodates multiple components in a line. In the component mounting machine, the leading end of the carrier tape is extended from a reel, and feed holes provided in the carrier tape engage with a sprocket in the vicinity of a component supply position of the tape feeder. The sprocket is rotationally driven by rotation of the driving motor. When the driving mechanism of the tape feeder is driven in this state, the carrier tape is fed in a predetermined supply direction with the rotational axis of the reel as a fulcrum, and components in the carrier tape sequentially move to the component supply position. The component mounting machine mounts components moved to the component supply position to the board.

In general, when the number of board types to be produced is large, the number of component types to be used is large. For this reason, in order to adequately produce multiple types of boards, it is necessary to perform set-up for exchanging the tape feeder and thus the components held in the component mounting machine based on a component usage schedule. In this set-up, an operator may manually disengage the carrier tape of the reel from the sprocket of the tape feeder to remove the reel. The reel can be removed, as described in Patent Document 1 for example, by the operator in a way such that the driving mechanism drives the tape feeder in a direction opposite to the normal rotation direction by a predetermined switch operation, which enables the operator to pull off the carrier tape from the engagement points with the sprocket.

PATENT LITERATURE

Patent Document 1: Japanese Patent Application Laid-Open No. 2000-261191

BRIEF SUMMARY

Technical Problem

However, in a system in which manual operation by an operator is required to drive the driving mechanism of the tape feeder in a direction opposite to the normal rotation direction when removing the reel, situations may occur such that a reel, whose removal is unnecessary based on the component usage schedule, is erroneously removed, or a large amount of time may be spent for selecting a tape feeder, from which a reel is supposed to be removed, based on the usage schedule.

It is an object of the present disclosure to provide a tape feeder set-up system capable of reliably removing reels accommodating components not scheduled for use, based on a usage schedule, in a manner that does not use much labor.

Solution to Problem

The present description discloses a tape feeder set-up system comprising: a tape feeder having a driving mechanism for feeding a carrier tape, wound on a reel and accommodating multiple components, in a predetermined feed direction; a loading table on which the tape feeder can be loaded; a scheduled use determination section for determining whether a component in the tape feeder loaded on the loading table is scheduled to be used based on a component usage schedule, and a control section for reversing the carrier tape in a direction opposite to the predetermined feed direction by controlling the driving mechanism of the tape feeder when the scheduled use determination section determines that the component is not scheduled to be used.

According to the present disclosure, the carrier tape corresponding to the tape feeder can be reversed in a direction opposite to the predetermined feed direction by controlling the driving mechanism of the tape feeder when a component in a tape feeder loaded on the loading table is not scheduled to be used based on the usage schedule for reel components. In this way, the engagement between the carrier tape and the tape feeder can be released without manual operation by the operator. In other words, by controlling the driving mechanism to reverse the carrier tape when removing, from the tape feeder, the reel accommodating the component which is not scheduled to be used, the operator can avoid having to recognize the reversing target carrier tape and perform manual operation for the purpose of reversing the carrier tape. As a result, the reel accommodating the component which is not scheduled to be used based on the usage schedule can be removed with high reliability and without consuming much labor from the operator.

DESCRIPTION OF EMBODIMENTS

<1. Configuration of Component Mounting Machine>

Figure 1:
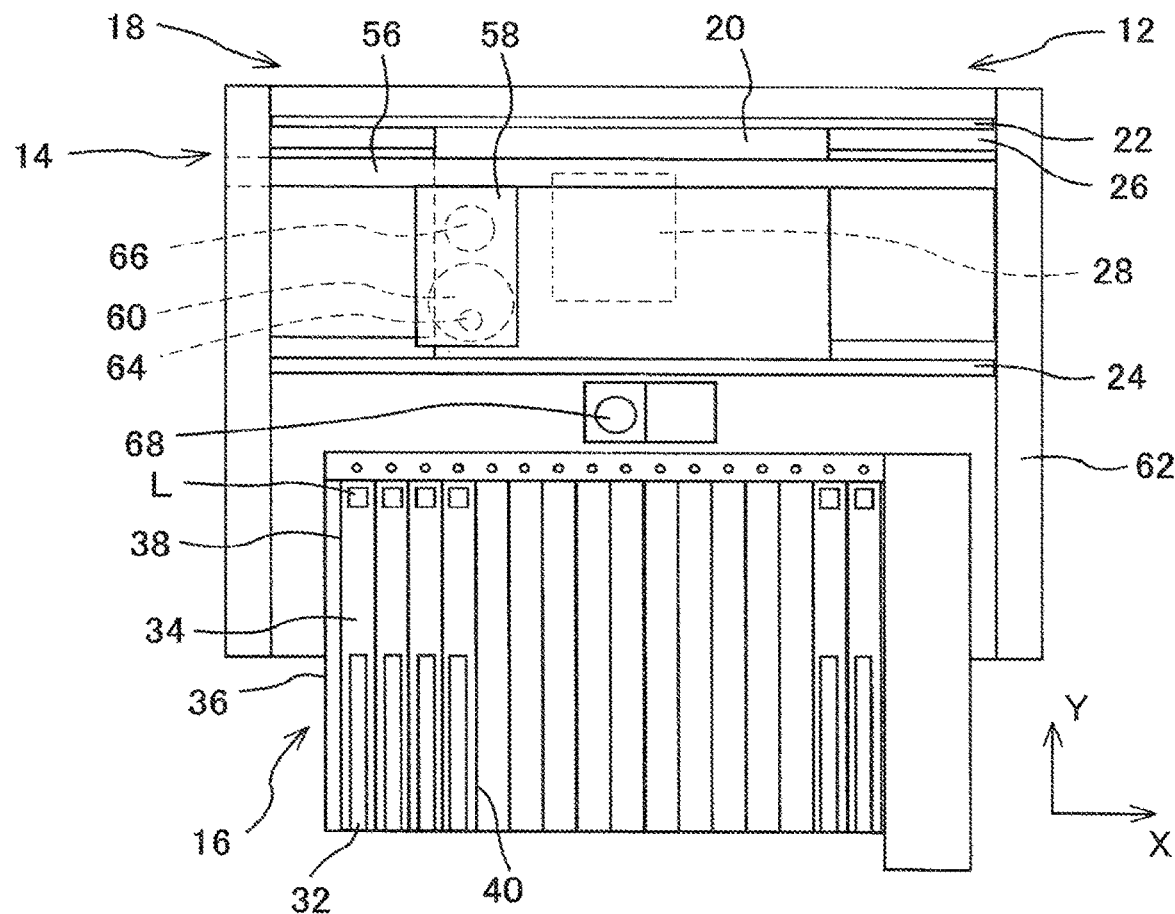
FIG. 1 A top view of a component mounting machine using a tape feeder that is a set-up target for a tape feeder set-up system of an embodiment of the present disclosure.

A configuration of component mounting machine 12 using a tape feeder that is a set-up target for tape feeder set-up system 10 of an embodiment of the present disclosure will be described with reference to the drawings. Component mounting machine 12 is a device provided in a board production line. As shown in FIG. 1, component mounting machine 12 includes board conveyance section 14, component supply section 16, and component transfer section 18.

Board conveyance section 14 is a device that conveys board 20, such as a circuit board that is a target of a production. Board conveyance section 14 includes a pair of guide rails 22, 24, conveyor belt 26, and clamping device 28. The pair of guide rails 22, 24 are disposed parallel to each other with a space therebetween. Guide rails 22, 24 guide board 20 in the conveyance direction X. Conveyor belt 26 is a belt member on which board 20 can be loaded and is rotatably provided. Board 20 is conveyed in the conveyance direction X with conveyor belt 26 while being guided by the pair of guide rails 22, 24. Clamping device 28 is disposed at a predetermined component mounting position in the conveyance direction X. Clamping device 28 is capable of clamping board 20. Board 20 is positioned with clamping device 28 when board 20 is conveyed by conveyor belt 26 to a predetermined component mounting position.

Figure 2:
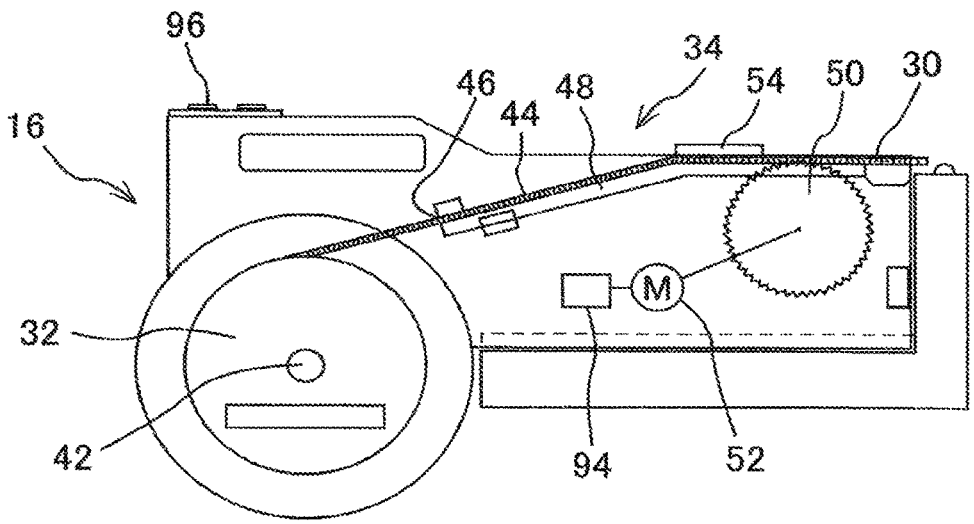
FIG. 2 A side view of the tape feeder and the reel of the present embodiment.

Component supply section 16 is a device for supplying component 30 to be mounted on board 20 to predetermined component transfer position L. As shown in FIG. 2, component supply section 16 includes reel 32 and tape feeder 34. Reel 32 and tape feeder 34 are loaded on loading table 36. Reel 32 is indirectly loaded on loading table 36 as a result of being detachably held in tape feeder 34.

Loading table 36 is a wheeled table that is detachable from component mounting machine 12, and, in addition to being securable at a position on board conveyance section 14, loading table 36 can be separated from board conveyance section 14. Loading table 36 has feeder holding section 38 for holding tape feeder 34. Feeder holding section 38 has multiple slots 40. The multiple slots 40 are provided so as to be aligned in the conveyance direction X when loading table 36 is mounted on component mounting machine 12. Each slot 40 is assigned a slot number different from each other. Each slot 40 removably holds one tape feeder 34.

Tape feeder 34 has reel holding shaft 42 for holding reel 32. Reel holding shaft 42 removably and rotatably holds reel 32. Reel 32 is a rotating body around which carrier tape 44 accommodating multiple components 30 is wound. Carrier tape 44 has recesses for accommodating each component 30 on a one-to-one basis. Reel 32 is rotatably supported by reel holding shaft 42 of tape feeder 34. Reel 32 is provided for each type of component 30. Each reel 32 can accommodate a certain number of components 30, the number being dependent on the type of component.

Tape feeder 34 is a device for running carrier tape 44 wound around reel 32 held by reel holding shaft 42. Carrier tape 44 is run by feeding in a predetermined feed direction (in particular, from the tape insertion port 46 side to the predetermined component transfer position L side) or reversing in a direction opposite to the predetermined feed direction. Tape feeder 34 has, as a driving mechanism, tape insertion port 46, guide rail 48, sprocket 50, and electric motor 52.

In loading table 36, carrier tape 44 wound around reel 32 is inserted into tape insertion port 46 of tape feeder 34. Guide rail 48 extends from tape insertion port 46 toward board conveyance section 14. Carrier tape 44 may be inserted into tape insertion port 46 and then directed along guide rail 48 toward the board conveyance section 14 side while being guided by guide rail 48. Carrier tape 44 has sprocket holes separate from the recesses which accommodate components 30. Sprocket 50 is disposed at a predetermined component transfer position L in the main body of tape feeder 34. Sprocket 50 is rotatably supported by the main body of tape feeder 34. The teeth of sprocket 50 fit into and engage the sprocket holes of carrier tape 44 guided by guide rails 48.

Electric motor 52 is connected to the shaft of sprocket 50. Electric motor 52 can rotate sprocket 50 in a rotation direction (i.e., a forward direction) that delivers carrier tape 44 in a predetermined feed direction and can rotate carrier tape 44 in a rotation direction (i.e., a reverse direction) that reverses the predetermined feed direction. When loading table 36 is mounted on component mounting machine 12, electric motor 52 is rotatable by power supplied from component mounting machine 12. Sprocket 50 is driven to rotate in either the normal rotation direction or the reverse rotation direction by rotation of electric motor 52.

When sprocket 50 is rotationally driven in the normal rotation direction by electric motor 52, carrier tape 44 is pulled out from reel 32 pivotally supported by tape feeder 34 and is fed to guide rail 48 in the predetermined feeding direction. Carrier tape 44 may be fed incrementally by a predetermined length. Tape peeling mechanism 54 is provided on the upper surface of guide rail 48 at a position close to sprocket 50. Tape peeling mechanism 54 peels off the cover tape of carrier tape 44, thereby allowing the components 30 accommodated in the base tape to be picked up by component transfer section 18. Components 30 reach predetermined component transfer position L at the end of the board conveyance section 14 side of guide rail 48 by feeding carrier tape 44 and are then picked up by component transfer section 18 and transferred toward board 20.

Component transfer section 18 is a device for transferring component 30 from predetermined component transfer position L toward board 20 positioned at the predetermined component mounting position. Component transfer section 18 includes Y-axis slider 56, X-axis slider 58, and mounting head 60.

Y-axis slider 56 is supported by guide rails 62. Guide rails 62 extend in a direction orthogonal to the conveyance direction X of board 20 by board conveyance section 14 (hereinafter referred to as the orthogonal direction Y) and are disposed above board conveyance section 14. Y-axis slider 56 is movable in the orthogonal direction Y. A Y-axis servo motor (not shown) is mechanically coupled to Y-axis slider 56. Y-axis slider 56 is moved along guide rails 62 in the orthogonal direction Y by Y-axis servo motor.

X-axis slider 58 is attached to Y-axis slider 56 so as to be movable in the conveyance direction X. An X-axis servo motor (not shown) fixed to Y-axis slider 56 is mechanically coupled to X-axis slider 58. X-axis slider 58 is moved to a position in the conveyance direction X by the X-axis servo motor.

Mounting head 60 is attached to X-axis slider 58. Mounting head 60 detachably holds suction nozzle 64 capable of picking up component 30. Mounting head 60 may be capable of holding multiple suction nozzles 64. Mounting head 60 is positionally movable in a vertical direction Z orthogonal to both the conveyance direction X and the orthogonal direction Y. Suction nozzle 64 of mounting head 60 picks up component 30, being already at predetermined component transfer position L of component supply section 16, by using negative pressure or the like, and mounts the picked up component 30 onto board 20, being positioned at the predetermined component mounting position, by releasing the suction.

Board camera 66 is attached to X-axis slider 58. Board camera 66 captures an image of a fiducial mark of board 20 positioned at a predetermined component mounting position from above to acquire board position reference information, or captures an image of component 30 arriving at predetermined component transfer position L from above to acquire component positional information. The component positional information is used for position control and orientation control of suction nozzle 64 when component 30 is being picked up by suction nozzle 64 of mounting head 60. The board position reference information is used for position control and orientation control of suction nozzle 64 when component 30 picked up by suction nozzle 64 of mounting head 60 is mounted on board 20.

Component camera 68 is attached to the base of component transfer section 18. Component camera 68 captures an image of component 30 picked up by suction nozzle 64 of mounting head 60 from below and acquires orientation information and the like of component 30. The orientation information is used for position and orientation control of suction nozzle 64 when component 30 picked up by suction nozzle 64 of mounting head 60 is being mounted on board 20.

<2. Configuration of Tape Feeder Set-Up System>

Figure 3:
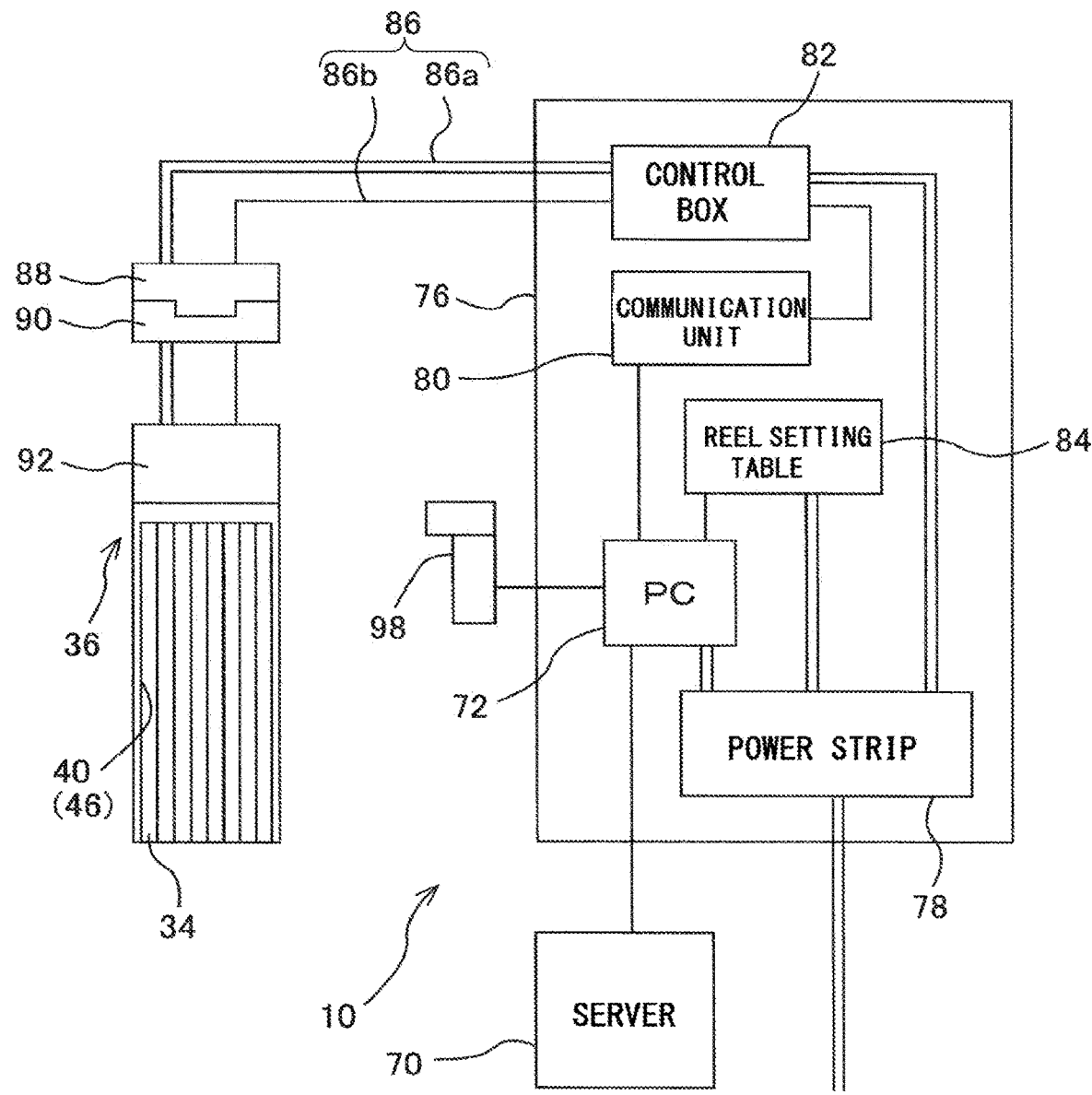
FIG. 3 A configuration diagram of the tape feeder set-up system of the present embodiment.

Tape feeder set-up system 10 is a system for performing a set-up to exchange reel 32 and tape feeder 34 loaded on loading table 36, which is detachable from component mounting machine 12. Tape feeder set-up system 10 is for performing the above-described set-up with loading table 36 in a state detached from component mounting machine 12 in an external set-up area provided separately from the board production line in which component mounting machine 12 is installed. As shown in FIG. 3, tape feeder set-up system 10 includes server 70, personal computer (PC) 72, and loading table 36.

Server 70 is a host computer that manages production plans using one or more component mounting machines 12 installed in a factory or operation thereof, production of board 20, supplying of components 30, and the like. Production plans include production plans of multiple types of boards 20 over a predetermined period of time, for example, one week or one month, and also includes usage schedules indicating the types and number of components 30 to be used in accordance with the production plan of board 20. These production plans may be sequentially updated. Server 70 stores a production plan for board 20 and a usage schedule for component 30.

Figures 4, 5:
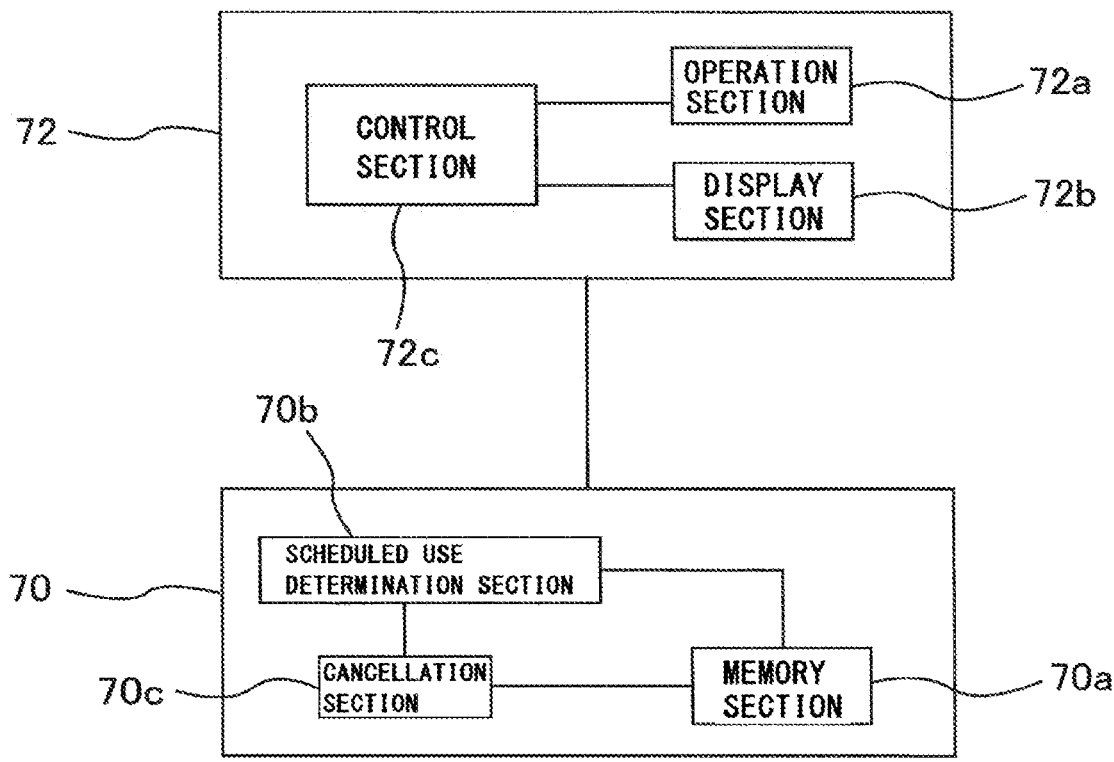
FIG. 4 A block diagram of a server and a computer provided in the tape feeder set-up system of the present embodiment.
FIG. 5 A diagram showing an example of links between loading table ID, tape feeder ID, and reel ID in rows stored in a memory section provided in the tape feeder set-up system of the present embodiment.

As shown in FIG. 4, server 70 includes memory section 70a, scheduled use determination section 70b, and cancellation section 70c. Memory section 70a is capable of storing management information on a per loading table 36 basis, loading tables 36 being detachable from component mounting machine 12. Memory section 70a can store identification codes for loading table 36, identification codes for tape feeder 34 detachable from loading table 36, and identification codes for reel 32 detachable from loading table 36. ID for loading table 36 need not be stored in memory section 70a.

In particular, as shown in FIG. 5, in order to mount component 30 on board 20 with component mounting machine 12, memory section 70a links and stores the ID for loading table 36, the ID for tape feeder 34 loaded on loading table 36, and the ID for reel 32 from which carrier tape 44 is fed by tape feeder 34 in a predetermined feed direction. Incidentally, FIG. 5 shows a state in which loading table 36 whose ID is D001, tape feeder 34 whose ID is F011, and reel 32 whose ID is R101 are linked and stored, and loading table 36 whose ID is D002, tape feeder 34 whose ID is F012, and reel 32 whose ID is R102 are linked and stored, and loading table 36 whose ID code is D003, tape feeder 34 whose ID is F013, and reel 32 whose ID is R103 are linked and stored. The links stored in memory section 70a need only consist of the link between the ID of tape feeder 34 and the ID of reel 32, and need not include the ID of loading table 36.

Scheduled use determination section 70b and cancellation section 70c are functions performed by the CPU in the server 70. Scheduled use determination section 70b determines whether component 30 is scheduled to be used, as described later. Cancellation section 70c cancels the link between the ID of tape feeder 34 and the ID of reel 32, which are stored in memory section 70a, as described later.

The ID of loading table 36 is attached to a readable portion of loading table 36 in the form of a bar code or the like. The ID of tape feeder 34 is attached to a readable portion of tape feeder 34 in the form of a bar code or the like. The ID of reel 32 is attached to a readable portion of reel 32 in the form of a bar code or the like. Further, the ID of reel 32 includes information on the type of component 30 accommodated in carrier tape 44 wound around reel 32.

PC 72 is a computer mounted on setup station 76 installed in the external set-up area. Setup station 76 includes power strip 78, communication unit 80, control box 82, and reel setting table 84. Power strip 78 is connected to a factory power supply and is capable of outputting, for example, AC 100 volts. Power strip 78 is electrically connected to PC 72, control box 82, and reel setting table 84, and can supply power to each of these connection targets. PC 72 is operable by having power supplied from power strip 78. PC 72 includes operation section 72a which can be operated by input from an operator, display section 72b which can be visually checked by the operator, and control section 72c, which is a central processing unit (CPU).

Control section 72c of PC 72 is communicatively connected to server 70 via LAN and the like and is also communicatively connected to communication unit 80 via USB cable and the like. Communication unit 80 is communicatively connected to control box 82. Connector 88 is connected to control box 82 via harness 86 including power supply line 86a and communication line 86b. Control box 82 is a signal repeater for outputting communication information from control section 72c of PC 72 and communication unit 80 to the connector 88 side via communication line 86b in addition to being a power repeater for outputting power supplied from power strip 78 to the connector 88 side via power supply line 86a. Control box 82 has a switch that can be operated by an operator, and the above-mentioned power output and communication output may be executed by operating the switch.

Connector 90 provided to loading table 36 is attachable/detachable with respect to connector 88 of setup station 76. Connectors 88, 90 have shapes capable of being connected to each other. Connector 90 is connected to connector 92 provided to each slot 40 of feeder holding section 38 of loading table 36 via a harness. A feeder-side connector (not shown) provided to tape feeder 34 is attachable/detachable with respect to connector 92 of each slot 40. Connector 92 and the feeder-side connector have shapes capable of being connected to each other. The feeder-side connector is connected to feeder control section 94 and electric motor 52 of tape feeder 34. Feeder control section 94 and electric motor 52 of each tape feeder 34 are connected to loading table 36 and setup station 76 by connecting the feeder-side connector to connector 92 of the corresponding slot 40.

Feeder control section 94 is a computer control device having a CPU operated by software. Feeder control section 94 stores the ID of tape feeder 34. With connectors 88, 90 connected to each other and connector 92 and the feeder-side connector connected to each other, feeder control section 94 is supplied with power from power strip 78 and is communicably connected to control section 72c of PC 72. Feeder control section 94 is electrically connected to electric motor 52 and executes rotation control of electric motor 52. Electric motor 52 of tape feeder 34 mounted on loading table 36 is rotatable by power supplied from power strip 78 when connectors 88, 90 are connected to each other and connector 92 and feeder-side connector are connected to each other, and is rotationally controlled by instructions from control section 72c of PC 72 via feeder control section 94.

When loading table 36 is mounted on component mounting machine 12, connector 90 of loading table 36 may be connected to a connector (not shown) provided on component mounting machine 12. In this case, feeder control section 94 is supplied with power from component mounting machine 12, is connected in communication with a computer included in component mounting machine 12, and executes rotation control of electric motor 52 in the normal rotation direction according to instructions from the computer. Electric motor 52 is rotatable by power supplied from component mounting machine 12 and is controlled to rotate according to instructions from the computer of component mounting machine 12 via feeder control section 94. As an alternative to this configuration, in the case where loading table 36 is mounted on component mounting machine 12, while feeder control section 94 is supplied with power from component mounting machine 12, rotation control, which automatically rotates electric motor 52 in the normal rotation direction by a predetermined amount in case of component 30 being no longer present at predetermined component transfer position L, may be also executed to feed carrier tape 44 by a predetermined stroke amount in the predetermined feed direction.

Tape feeder 34 also includes operation switch 96. Operation switch 96 is provided on, for example, the top face of tape feeder 34, enabling operation by the operator. Operation switch 96 includes, for example, a feed switch for feeding carrier tape 44 wound on reel 32 and a reversing switch for reversing carrier tape 44.

Operation switch 96 is electrically connected to feeder control section 94. Feeder control section 94 detects whether operation switch 96 is being operated. When feeder control section 94, for example, with loading table 36 being mounted on setup station 76, detects that operation of operation switch 96 is being executed when the operation of operation switch 96 is enabled, in accordance with the switch operation, rotation control of electric motor 52 causes carrier tape 44 of reel 32 held in tape feeder 34 to feed in the predetermined feed direction or reverse in the opposite direction.

Feeder control section 94 may continuously feed or reverse carrier tape 44 while operation switch 96 is on and stop feeding or reversing the carrier tape 44 when operation switch 96 is off, or may feed or reverse carrier tape 44 by a predetermined amount by one operation of operation switch 96.

Control section 72c of PC 72 is also communicatively connected to reel setting table 84. Reel setting table 84 is a setting table for allowing the operator to attach/detach reel 32 on which carrier tape 44 is wound to and from tape feeder 34 and to prepare reel 32 to be exchanged so as to be loadable on loading table 36. Bar code reader 98 can be communicatively connected to control section 72c of PC 72.

Bar code reader 98 is a reading device for reading a bar code indicating the ID attached to each loading table 36 or reading a bar code indicating the ID attached to reel 32 scheduled to be exchanged on reel setting table 84 and tape feeder 34. Control section 72c of PC 72 can store the IDs of loading table 36, reels 32, and tape feeder 34 read by bar code reader 98. Control section 72c of PC 72 can recognize the IDs of tape feeders 34 stored in feeder control section 94 by communicating with feeder control section 94 of tape feeder 34. Control section 72c of PC 72 can link the IDs of loading tables 36, the IDs of tape feeders 34, and the IDs of reels 32 and outputs them to server 70. Server 70 links the IDs of loading tables 36, the IDs of tape feeders 34, and the IDs of reels 32, which are sent as data from PC 72 and stores the linked information in memory section 70a.

Figure 7:
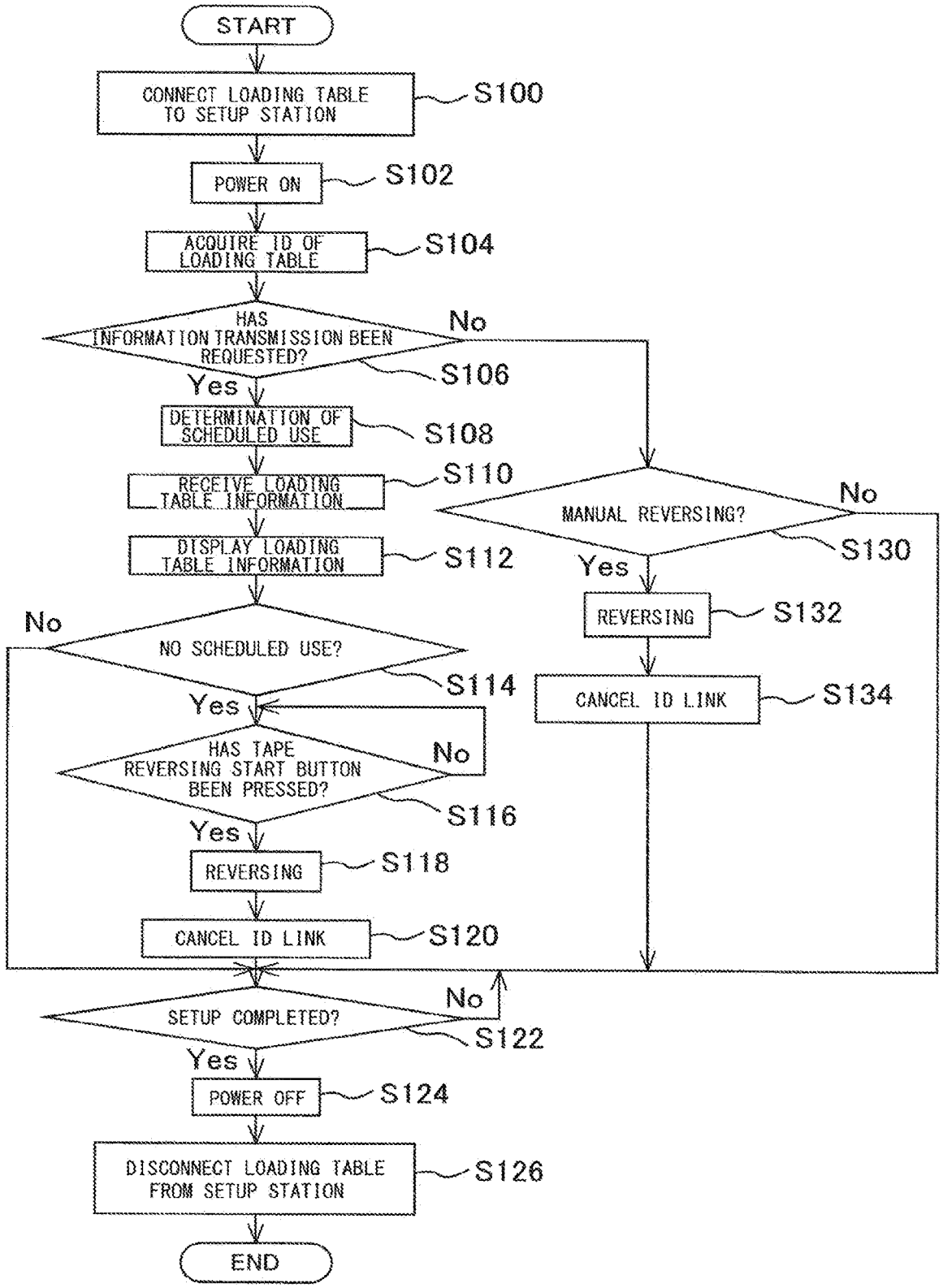
FIG. 7 An example operation flow chart implemented in the tape feeder set-up system of the present embodiment.

In tape feeder set-up system 10 described above, when loading table 36 detached from component mounting machine 12 is brought into the external set-up area by the operator, first, in step S100 of the routine shown in FIG. 7, connector 90 of loading table 36 is manually connected to connector 88 of setup station 76 by the operator. Then, in step S102, the power is automatically outputted by control box 82 or is switched on by the operator with the switch of control box 82. After this process is performed, loading table 36 can communicate with PC 72 and server 70.

When connector 88 of setup station 76 and connector 90 of loading table 36 are connected to each other, feeder control section 94 and electric motor 52 of tape feeder 34 loaded on loading table 36 become operable. After connectors 88, 90 are connected to each other, in step S104, control section 72c of the PC 72 acquires the ID of loading table 36 by reading the ID of loading table 36 with bar code reader 98 manually or automatically.

The operator can confirm the information associated with loading table 36 mounted on setup station 76, which may include information of tape feeders 34 currently held in each slot 40 of loading table 36 and reels 32 held in tape feeders 34. After acquiring the ID of loading table 36 installed in setup station 76, control section 72c of PC 72 determines, in step S106, whether a predetermined operation for requesting the operator to transmit the information to operation section 72a was implemented. When it is determined that the predetermined operation has been implemented, control section 72c requests server 70 to transmit information linked to the ID of loading table 36.

Upon receiving the above-described information transmission request from PC 72, server 70 reads out and identifies information linked with the ID of loading table 36 from memory section 70a. Information linked to the ID of loading table 36 includes the presence or absence of tape feeder 34 mounted in each slot 40 of loading table 36, the ID of tape feeder 34 held in slot 40, the ID of reel 32 held in tape feeder 34, the usage schedule of component 30 accommodated in carrier tape 44 of reel 32, the slot number of slot 40 to which tape feeder 34 holding reel 32 will be mounted in next, the slot number of slot 40 at which tape feeder 34 or reel 32 is scheduled to be exchanged, and information of component mounting machine 12 scheduled to mount loading table 36 next.

Upon identifying the information linked with the ID of loading table 36 as described above, server 70 first determines, in step S108, whether component 30 is scheduled to be used based on the usage schedule of component 30 in scheduled use determination section 70b. The component usage schedule by server 70 is determined for tape feeders 34 currently held in slots 40 of loading table 36, and is performed for each tape feeder 34, that is, for each reel 32 currently held in tape feeders 34.

Note that "component 30 is scheduled to be used" means that reel 32 is scheduled to be used in the currently held tape feeder 34, and may include, for example, being used even once during a predetermined period. On the other hand, "component 30 is not scheduled to be used" means that reel 32 is not scheduled for use in the currently held tape feeder 34, and may include, for example, component 30 being discarded or not being scheduled for use once for a predetermined period of time (e.g., one week), or component 30 being scheduled for future use in tape feeder 34 other than the current tape feeder 34.

When component 30 of reel 32 held by tape feeder 34 is scheduled to be used by tape feeder 34, it is not necessary to pull out carrier tape 44 of reel 32 from tape feeder 34 or remove reel 32, and it is appropriate to keep carrier tape 44 engaged with sprocket 50 of tape feeder 34. On the other hand, when component 30 of reel 32 held by tape feeder 34 is not scheduled to be used with tape feeder 34, it is necessary to withdraw carrier tape 44 of reel 32 from tape feeder 34 or remove reel 32 in order to ensure efficient use of tape feeder 34.

When it is determined that component 30 of reel 32 held by tape feeder 34, being held in slot 40 of loading table 36, is not scheduled for use, server 70 sends information to PC 72, the information linked with the ID of loading table 36, as described above, including information indicating that component 30 of reel 32 held in tape feeder 34 is not scheduled to be used. On the other hand, when it is determined that component 30 of reel 32 held by tape feeder 34, being held in slot 40 of loading table 36, is scheduled for use, server 70 sends information to PC 72, the information linked with the ID of loading table 36, as described above, not including information indicating that component 30 of reel 32 held in tape feeder 34 is not scheduled to be used.

Control section 72c of PC 72 receives information related to the ID of loading table 36 from server 70 in step S110 after the above information transmission request is made to server 70 and displays the received information in display section 72b in step S112 so as to make the received information visible to the operator. This display includes, for example, whether tape feeder 34 is mounted in each slot 40 of feeder holding section 38 of loading table 36, the ID of tape feeder 34 currently mounted in slot 40, the ID of reel 32 currently held in tape feeder 34, the slot number of slot 40 to which tape feeder 34 holding reel 32 is scheduled to be mounted next, the slot number of slot 40 for tape feeder 34 to be mounted which is scheduled to be exchanged, and the like.

In this manner, by displaying the information related to loading table 36 mounted on setup station 76 on display section 72b of PC 72, the operator can confirm the information and can check the alignment of tape feeder 34 and reel 32 mounted on loading table 36.

Figure 6:
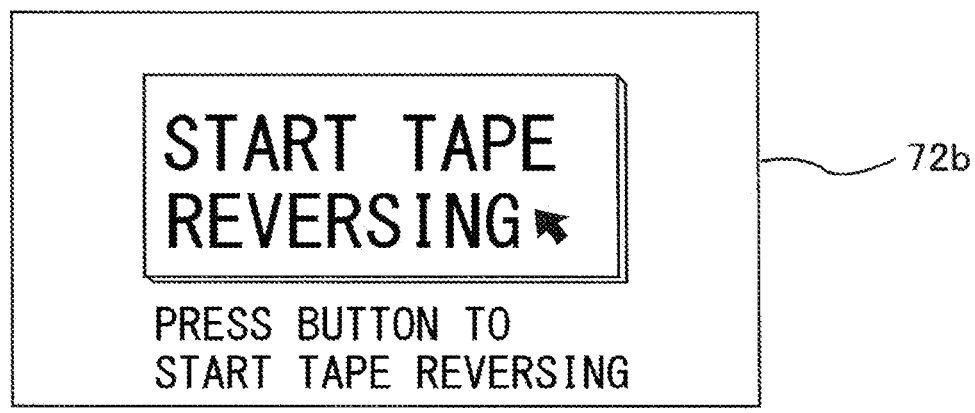
FIG. 6 A diagram showing an example of a screen for prompting an operator to start a reverse of a carrier tape in a direction opposite to a predetermined feed direction displayed on a display section provided in the tape feeder set-up system of the present embodiment.

Further, in a case in which control section 72c of PC 72 receives information related to the ID of loading table 36 from server 70 after making the above transmission request to server 70, when a positive determination in step S114 detects that the received information includes information indicating that component 30 of reel 32 held in one or more tape feeders 34 is not scheduled to be used, control section 72c displays the following information on display section 72b. Specifically, display section 72b indicates that component 30 is not scheduled to be used for reel 32, for which component 30 is not scheduled to be used, and therefore tape feeder 34, which holds reel 32, and, as shown in FIG. 6, a request is displayed to the operator to start the reverse of carrier tape 44 wound around reel 32 in the opposite direction and remove reel 32 from tape feeder 34.

In this manner, if PC 72 display section 72b indicates that component 30 of reel 32, and thus of tape feeder 34, is not scheduled to be used and displays a request to the operator to start reversing carrier tape 44 wound on reel 32 and remove reel 32 from tape feeder 34, the operator can confirm that reel 32, and thus tape feeder 34, for which component 30 is not scheduled to be used are present before carrier tape 44 is reversed and can check to see that carrier tape 44 of reel 32 is to be reversed in the opposite direction. The reversing of carrier tape 44 and the removal of reel 32 from tape feeder 34 can be started after the confirmation operation to operation section 72a by the operator.

When the information received from server 70 includes information indicating that component 30 of reel 32 currently held in a particular tape feeder 34 is not scheduled to be used, and when it is determined by the affirmative determination of step S116 that the operator has operated operation section 72a for starting the reversing of carrier tape 44 in the reverse direction, PC 72 control section 72c transmits, in step S118, a command for requesting carrier tape 44 accommodating component 30 not scheduled to be used to be reversed in the opposite direction to feeder control section 94 of tape feeder 34.

The reversing request command transmitted by PC 72 are intended for tape feeders 34 currently held in slots 40 of loading table 36. When there are multiple tape feeders 34 on which carrier tape 44 is to be reversed, that is, when there are multiple reels 32 to be removed from tape feeder 34, the reversing request command may be collectively transmitted to multiple targets or transmitted by time division individually. With the batch transmission, the reversing of carrier tape 44 in multiple tape feeders 34 can be started at the same time, making it possible to complete the reversing in a short time. Further, with individual transmissions, since the reversing of carrier tape 44 in the multiple tape feeders 34 can be started at different times, it is possible to prevent the power supply load from becoming excessively large, thereby making it possible to reduce the capacity required for the power supply.

When feeder control section 94 of tape feeder 34 receives a command from server 70 requesting that carrier tape 44 corresponding to tape feeder 34 be reversed in the opposite direction, feeder control section 94 rotates electric motor 52 of tape feeder 34 in the opposite direction. When this control operation is executed, electric motor 52 rotates so as to drive sprocket 50 to rotate in the reverse direction, whereby carrier tape 44 reverses in the direction opposite the predetermined feed direction.

The amount of reversing stroke to reverse carrier tape 44 in the opposite direction need only be enough to release the engagement between the sprocket holes of carrier tape 44 and sprocket 50 of tape feeder 34. The amount of reversing stroke may be a predetermined amount in order to simplify controlling the reversing. The amount of reversing stroke may vary depending on the distance from the teeth of sprocket 50 to the leading end of carrier tape 44, and may be preset for each type of tape feeder 34.

As described above, with tape feeder set-up system 10, when it is detected that tape feeder 34 holding reel 32 for which component 30 is not scheduled to be used is included among tape feeders 34 currently held in slots 40 of loading table 36 with loading table 36 in a state detached from component mounting machine 12 and mounted in setup station 76, and it is determined that component 30 of reel 32 held by tape feeder 34 is not scheduled to be used, electric motor 52 of tape feeder 34 can be rotated in the reverse direction in accordance with a command sent from server 70 to tape feeder 34 of loading table 36 via PC 72, whereby carrier tape 44 corresponding to tape feeder 34 can be reversed in the direction opposite to the predetermined feed direction. When there are multiple reels 32 for which component 30 is not scheduled to be used, carrier tape 44 can be reversed in the opposite direction for each reel 32, that is, for each tape feeder 34 corresponding to the multiple reels 32.

If carrier tape 44 is reversed in the opposite direction by a command from server 70 based on the usage schedule of component 30, the engagement between the sprocket holes of carrier tape 44 and the teeth of sprocket 50 of tape feeder 34 can be released without manual operation by an operator. If the engagement is released, the operator can easily pull carrier tape 44 out of tape feeder 34, specifically, tape insertion port 46, and remove reel 32 from tape feeder 34. Therefore, the work of the operator can be simplified by removing reel 32 on which carrier tape 44, for component 30 not scheduled to be used, is wound from tape feeder 34.

Further, in order to remove reel 32 around which carrier tape 44, having component 30 not scheduled to be used, is wound from tape feeder 34, the server 70 executes a determination as to whether reel 32 needs to be removed, and carrier tape 44 reverses in the opposite direction upon a command from server 70 based on the determination. As a result, when removing reel 32 from tape feeder 34 holding component 30 that is not scheduled to be used, due to being able to reverse carrier tape 44 by reversing the rotation direction of electric motor 52, it is not necessary for the operator to recognize carrier tape 44 as a reversing target and manually input a reverse command into PC 72 to reverse carrier tape 44.

Thus, it is possible to prevent the operator from accidentally reversing, in the opposite direction, carrier tape 44 of reel 32, whose removal is unnecessary based on the usage schedule of component 30 and to prevent the operator from accidentally removing reel 32 from tape feeder 34. Further, it is possible to reduce the number of man-hours spent by the operator in selecting tape feeder 34 from which reel 32 is to be removed in accordance with the usage schedule of component 30. As a result, it is possible to remove, from tape feeder 34, reel 32 holding component 30 which is not scheduled to be used based on the usage schedule with high reliability and without consuming much labor by the operator.

Further, in order for server 70 to rotate electric motor 52 of tape feeder 34 in the reversing direction in accordance with a command from server 70 to reverse carrier tape 44 corresponding to tape feeder 34 in a direction opposite to the predetermined feed direction after determining that component 30, of reel 32 held by tape feeder 34 currently held in slot 40 of loading table 36, is not scheduled to be used, it is necessary for display section 72b of PC 72 to display a request to the operator to operate operation section 72a to start the reversing of carrier tape 44 in the opposite direction and for the operator to perform the start operation. When the starting operation is performed by the operator, commands are sent from PC 72 to loading table 36, electric motor 52 rotates in the reverse direction, and carrier tape 44 reverses in the opposite direction.

Therefore, it is possible to prevent the reversing in the opposite direction of carrier tape 44, accommodating component 30 which is not scheduled to be used based on the usage schedule, from being performed in the external set-up area without the operator's recognition, thereby ensuring reliable reversing of carrier tape 44.

Further, in tape feeder 34 which is held in slot 40 of loading table 36, since it is determined that component 30 of reel 32 held in tape feeder 34 is not scheduled to be used, when carrier tape 44 accommodating component 30 is reversed in the opposite direction, server 70 cancels the link in step S120, using cancellation section 70c, by erasing the memory of the link stored in memory section 70a between the ID of tape feeder 34 and the ID of reel 32.

The above-described cancellation of the link by server 70 may be performed after it is determined that component 30 of reel 32 currently held in tape feeder 34 is not scheduled to be used. For example, the cancellation may be performed, after the determination, when a predetermined period of time in which the reversing of carrier tape 44 is expected to be completed has elapsed; when, in PC 72, server 70 detects that the operator has started the reversing of carrier tape 44; or when server 70, via PC 72, detects that carrier tape 44 has actually reversed in the opposite direction and the reversing has been completed (e.g., that the leading end of carrier tape 44 has disengaged from sprocket 50, or that the leading end of carrier tape 44 has been manually removed from tape insertion port 46).

Therefore, when carrier tape 44 is pulled out from tape feeder 34 and reel 32 is removed from tape feeder 34 based on the usage schedule of component 30 in setup station 76, the link between tape feeder 34, loading table 36, and reel 32 can be suitably managed in accordance with whether reel 32 is attached to feeder 34 and thus to loading table 36, and ID management can be performed on an individual loading table 36 basis. Further, upon canceling the link between the ID of reel 32 holding component 30 that is not scheduled to be used and the ID of tape feeder 34, it is not necessary for the operator to manually input a cancel command into PC 72 to cancel the link. Accordingly, the ID management associated with the removal, from tape feeder 34, of reel 32 holding component 30 which is not scheduled to be used based on the usage schedule can be performed reliably and without much labor from the operator.

Further, after connector 88 and connector 90 of loading table 36 are connected to each other at setup station 76 and feeder control section 94 and electric motor 52 of tape feeder 34 loaded on loading table 36 become operable, the operator can select and designate any one of tape feeders 34 currently held in slots 40 of loading table 36, individually reverse carrier tape 44 of reel 32 held by tape feeder 34 in the opposite direction, and remove reel 32 from tape feeder 34. If it is determined in step S106 that the predetermined operation for requesting the operator to transmit information to operation section 72a has not been performed, control section 72c of PC 72 next determines in step S130 whether the predetermined operation for selecting and designating the desired tape feeder 34 by the operator has been performed.

The selection of the optional tape feeder 34 described above is designated by an operation in operation section 72a of PC 72. Further, the above selection designation of target tape feeder 34 for which carrier tape 44 will be reversed in the opposite direction may be made so that it is possible to select tape feeders 34 one by one or all tape feeders 34 collectively. Further, the selection may be designated by operating operation switch 96 of tape feeder 34.

When the selection designation of tape feeder 34 as described above is made by a positive determination in step S130 and a predetermined start operation for manual reversing is performed, in step S132, a command is issued from PC 72 to feeder control section 94 of tape feeder 34 to execute the reversing in the opposite direction, and feeder control section 94 reverses carrier tape 44 of reel 32 held in tape feeder 34 by rotating electric motor 52 in the opposite direction. At this time, the reversing stroke amount for reversing carrier tape 44 in the opposite direction may be set in advance for reel 32. Further, the reversing stroke amount may be changed by inputting the reversing stroke amount to operation section 72a of PC 72 one by one for each reel 32 or collectively.

When feeder control section 94 performs the reversing control in the opposite direction based on the selection by the operator, carrier tape 44 of reel 32 held by tape feeder 34 is reversed in the opposite direction. As a result, in setup station 76, the engagement between the sprocket holes of carrier tape 44 and the teeth of sprocket 50 of tape feeder 34 can be released by manual operation of the operators PC 72 operation section 72a or operation switch 96 of tape feeder 34.

When feeder control section 94 performs the reversing control in the opposite direction based on the selection by the operator, a command requesting the cancellation of the link between the ID of tape feeder 34 and the ID of reel 32 are sent from PC 72 to server 70. When this command is sent to server 70, in step S134, server 70 cancels storing the link between the ID of tape feeder 34 and the ID of reel 32, which is stored in memory section 70a, from memory section 70a by cancellation section 70c, thereby canceling the link.

It should be noted that transmission of the cancellation request command from the PC 72 side to server 70 may be performed when a predetermined time has elapsed which is expected to complete a reversing of carrier tape 44 after the selection by the operator has been designated, or when PC 72 detects that carrier tape 44 has completed reversing in the opposite direction (for example, the leading end of carrier tape 44 has disengaged from sprocket 50, or the leading end of carrier tape 44 has been manually removed from tape insertion port 46 by the operator).

Therefore, even when carrier tape 44 is pulled out from tape feeder 34 and reel 32 is removed from tape feeder 34 based on the operator's selection in setup station 76, the link between tape feeder 34, loading table 36, and reel 32 can be suitably managed in accordance with whether reel 32 is mounted on tape feeder 34 and thus to loading table 36, and ID management can be performed on an individual loading table 36 basis. Further, in order to cancel the link between the ID of the tape feeder 34 selected by the operator and the ID of reel 32 corresponding to tape feeder 34, it is not necessary for the operator to manually input a command into PC 72 to cancel the link. Accordingly, the ID management associated with the removal, from tape feeder 34, of reel 32 from tape feeder 34 based on the operators selection designation can be performed reliably and without much labor from the operator.

In tape feeder set-up system 10, after reel 32 is removed from tape feeder 34 loaded on loading table 36, the operator may mount reel 32 which has been prepared in reel setting table 84 and scheduled to be exchanged onto tape feeder 34. The work of the operator may be performed according to the slot number of slot 40 and the like to which reel 32 is to be mounted, reel 32 being scheduled to be exchanged and displayed on display section 72b of PC 72. When reel 32 to be exchanged is newly held in tape feeder 34, the ID of loading table 36, the ID of tape feeder 34, and the ID of reel 32 read by using bar code reader 98 or the like may be linked to each other and stored in memory section 70a of server 70.

The storage of the linked IDs in memory section 70a may be performed, for example, when carrier tape 44 wound on reel 32 is inserted into tape insertion port 46 of tape feeder 34, or when carrier tape 44 is automatically fed to the predetermined component transfer position L side after insertion. Further, when the operator newly attaches a reel 32 to be exchanged to tape feeder 34 from which an old reel 32 has been removed, since the ID of the old reel 32 is not already linked with the ID of tape feeder 34, even when the operator does not perform the operation of linking the ID of tape feeder 34 with the ID of the new reel 32, it is possible to prevent the ID of reel 32 linked with the ID of tape feeder 34 from being different from the ID of the actual reel 32.

When a negative determination is made in step 114, when the link of the IDs is canceled in step S120 or step S134, or when a negative determination is made in step S130, control section 72c of PC 72 next determines in step S122 whether the setup of tape feeder 34 and reel 32 loaded on loading table 36 is completed. After the setup is completed and the ID of loading table 36 is registered or re-registered to server 70, the supply of power to loading table 36 is stopped and communication between loading table 36 and PC 72 or server 70 is stopped by the operator operating the switch of control box 82 in step S124. Thereafter, in step S126, loading table 36 is manually disconnected by the operator at the connection of connector 90 and connector 88, of set-up station 76, and is put on standby for board production or is mounted on the component mounting machine 12 to which loading table 36 is supposed to be mounted on and used for board production.

As apparent from the above description, tape feeder set-up system 10 of the present embodiment includes tape feeder 34, having electric motor 52, for feeding carrier tape 44 wound on reel 32 and accommodating multiple components 30 in a predetermined feed direction; loading table 36 on which tape feeder 34 can be loaded; scheduled use determination section 70b for determining whether component 30 in tape feeder 34 loaded on loading table 36 is scheduled to be used based on a component usage schedule, and control section 72c for reversing carrier tape 44 in a direction opposite to the predetermined feed direction by controlling electric motor 52 of tape feeder 34 when scheduled use determination section 70b determines that component 30 is not scheduled to be used.

With this configuration, when tape feeder 34 loaded on loading table 36 having a component 30 that is not scheduled to be used based on the usage schedule of component 30 of reel 32, carrier tape 44 corresponding to tape feeder 34 can be reversed in the direction opposite to the predetermined feed direction by controlling electric motor 52 of tape feeder 34. As a result, the engagement between carrier tape 44 and tape feeder 34 can be released without manual operation by the operator. That is, when removing reel 32 from tape feeder 34 holding component 30 that is not scheduled to be used, due to being able to reverse carrier tape 44 by reversing the rotation direction of electric motor 52, it is not necessary for the operator to recognize carrier tape 44 as a reversing target and manually input a reverse command into PC 72 to reverse carrier tape 44. Accordingly, it is possible to remove reel 32 holding component 30 which is not scheduled to be used based on the usage schedule with high reliability and without the operator consuming much labor.

Further, in tape feeder set-up system 10, control section 72c reverses carrier tape 44 in a direction opposite to the predetermined supply direction when a predetermined start operation to operation section 72a is performed after scheduled use determination section 70b determines that component 30 is not scheduled for use.

With this configuration, it is possible to start the reversing of carrier tape 44 accommodating component 30 that is not scheduled to be used based on the usage schedule under the condition that a predetermined start operation of operation section 72a of PC 72 is performed. Therefore, it is possible to prevent the carrier tape from being reversed without the operator being aware, thereby ensuring reliable reversing of the carrier tape.

Tape feeder set-up system 10 further includes display section 72b for displaying a request to an operator to start reversing carrier tape 44 in the opposite direction when scheduled use determination section 70b determines that component 30 is not scheduled for use.

With this configuration, the operator can confirm the presence of reel 32, and thus tape feeder 34, for which component 30 is not scheduled to be used before implementing the reversing of carrier tape 44 and can become aware in advance about the reversing of carrier tape 44 of reel 32 in the opposite direction.

In tape feeder set-up system 10, control section 72c reverses carrier tape 44 in the opposite direction by a predetermined amount. With this configuration, it is possible to simplify the reversing control of the carrier tape.

Further, tape feeder set-up system 10 includes memory section 70a for linking and storing the ID of tape feeder 34 and the ID of reel 32 from which carrier tape 44 is fed by tape feeder 34 in order to mount component 30 onto board 20 by component mounting machine 12, and cancellation section 70c for canceling the link between the ID of tape feeder 34 stored in memory section 70a and the ID of reel 32 when control section 72c reverses carrier tape 44 is reversed in the opposite direction.

With this configuration, when carrier tape 44 accommodating component 30 that is not scheduled to be used is reversed, cancellation section 70c can cancel the link between the ID of tape feeder 34 and the ID of reel 32 stored in memory section 70a. Therefore, in order to cancel the link between the ID of reels 32 holding component 30 that is not scheduled to be used and the ID of tape feeder 34, it is not necessary for the operator to manually input a cancel command into PC 72 to cancel the link. Accordingly, the ID management associated with the removal, from tape feeder 34, of reel 32 holding component 30 which is not scheduled to be used based on the usage schedule can be performed reliably and without much labor from the operator. Further, when the operator attaches the new reel 32 to tape feeder 34 from which the old reel 32 has been removed, since the ID of the old reel 32 is not already linked with the ID of tape feeder 34, even when the operator does not perform the operation of linking the ID of tape feeder 34 with the ID of the new reel 32, it is possible to prevent the ID of reel 32 linked with the ID of tape feeder 34 from being different from the ID of the actual reel 32.

Further, tape feeder set-up system 10 includes server 70 for storing the usage schedule for components 30, and PC 72 communicatively connected to server 70 and to electric motor 52 of tape feeder 34 loaded on loading table 36 via control boxes 82. Control section 72c is provided in PC 72.

With this configuration, control section 72c for controlling the reversal of carrier tape 44 with electric motor 52 of tape feeder 34 can be implemented using a computer provided separately from the server.

In tape feeder set-up system 10, loading table 36 is attachable/detachable from component mounting machine 12, and control section 72c reverses carrier tape 44 in the opposite direction in a state in which loading table 36 is detached from component mounting machine 12.

With this configuration, carrier tape 44 can be reversed by using electric motor 52 of tape feeder 34 supplied with power from the outside even while loading table 36 is removed from component mounting machine 12.

Further, tape feeder set-up system 10 includes tape feeder 34 having electric motor 52 for feeding carrier tape 44 wound around reel 32 and accommodating multiple components 30 in a predetermined feed direction; control section 72c for reversing carrier tape 44 in a direction opposite to the predetermined feed direction by controlling electric motor 52; memory section 70a for storing the ID of tape feeder 34 linked with the ID of reel 32 from which carrier tape 44 is fed by tape feeder 34 in order to mount component 30 on board 20 by component mounting machine 12, and cancellation section 70c for canceling the link between the ID of tape feeder 34 stored in memory section 70a and the ID of reel 32 when control section 72c reverses carrier tape 44 in the opposite direction.

With this configuration, when carrier tape 44 accommodating component 30 is reversed at the time of removing reel 32 holding component 30 from tape feeder 34 or the like, the link between the ID of tape feeder 34 stored in memory section 70a and the ID of reel 32 can be cancelled by cancellation section 70c. Therefore, with the cancellation of the link between the ID of reel 32 holding component 30 and the ID of tape feeder 34, it is not necessary for the operator to manually input a cancellation command into PC 72 to cancel the link. Accordingly, the ID management associated with the removal of reel 32 holding component 30 from tape feeder 34 can be performed reliably and without much labor from the operator. Further, when the operator attaches the new reel 32 to tape feeder 34 from which the old reel 32 has been removed, since the ID of the old reel 32 is not already linked with the ID of tape feeder 34, even when the operator does not perform the operation of linking the ID of tape feeder 34 with the ID of the new reel 32, it is possible to prevent the ID of reel 32 linked with the ID of tape feeder 34 from being different from the ID of the actual reel 32.

In the above embodiment, carrier tape 44 of reel 32 for which component 30 is not scheduled to be used is reversed in the opposite direction by a predetermined stroke amount in order to simplify the reversing control operation. However, the present disclosure is not limited to this, and the reversing in the opposite direction may be performed until the leading end of carrier tape 44 returns to a predetermined position in tape feeder 34.

In this modification, for example, if a sensor capable of detecting carrier tape 44 is disposed in the vicinity of the engagement point along guide rail 48, on the tape insertion port 46 side with respect to the engagement point between carrier tape 44 and sprocket 50 of tape feeder 34, and the presence or absence of carrier tape 44 is detected using the sensor, the detection result of the sensor changes from the tape being present to the tape being absent when carrier tape 44 is disengaged from sprocket 50 of tape feeder 34. Therefore, if the reversing of carrier tape 44 in the opposite direction is stopped when this change occurs, the engagement between carrier tape 44 and sprocket 50 of tape feeder 34 can be reliably released without unnecessarily rotating electric motor 52.

In the above embodiment, reel 32 is attachably/detachably held by tape feeder 34, and tape feeder 34 is attachably/ detachably held by loading table 36. However, the present disclosure is not limited to this, and tape feeder 34 may be fixed and held to loading table 36 in a non-detachable manner.

Further, in the above-described embodiment, reel 32 for winding carrier tape 44 is attachably/detachably held by tape feeder 34 and thus indirectly loaded onto loading table 36. However, the present disclosure is not limited to this, and reel 32 may be directly loaded onto loading table 36 in an attachable/detachable manner while being held by a reel holding section of loading table 36 without being held by tape feeder 34.

Figure 8:
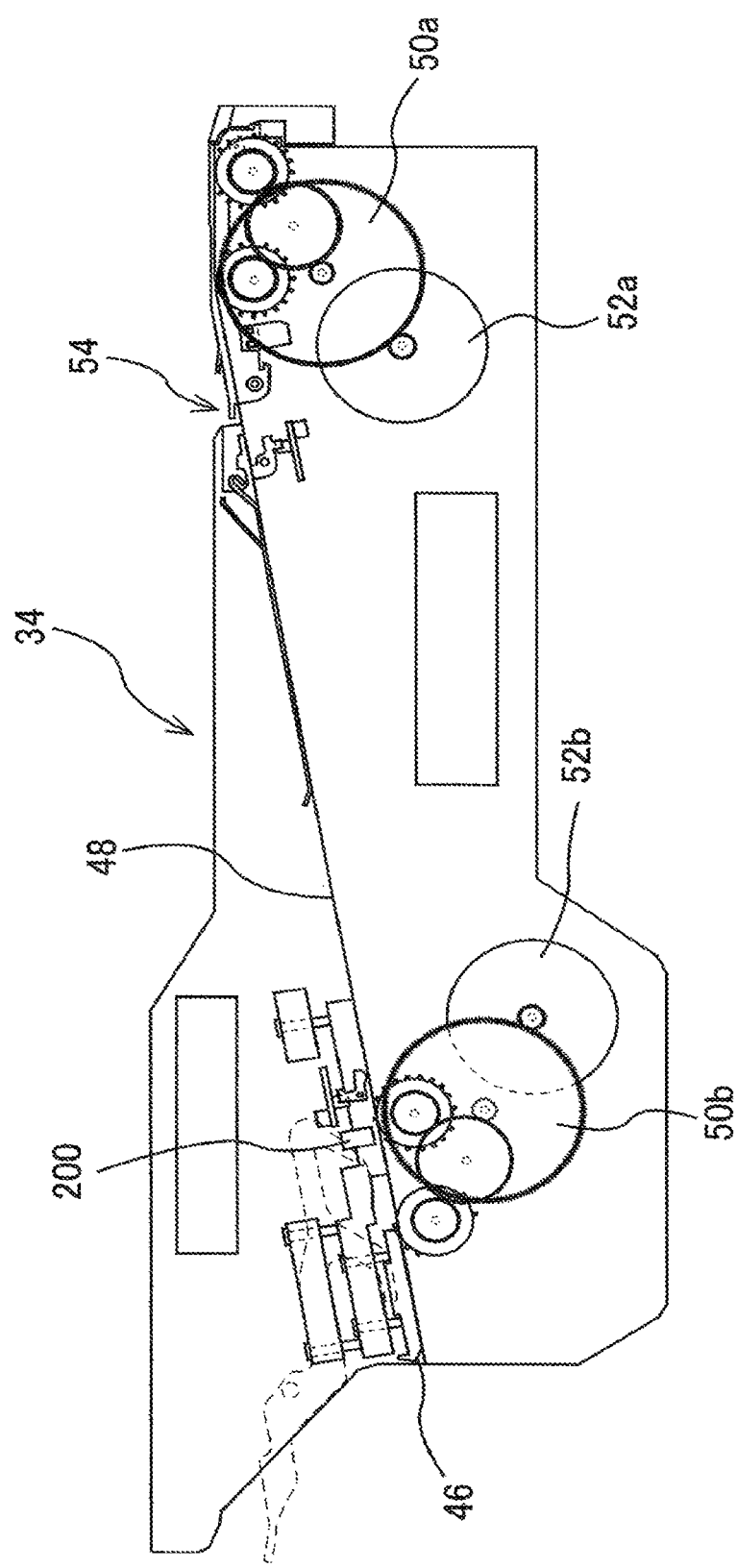
FIG. 8 A side view of a tape feeder of one modification of the present disclosure.

In the above embodiment, only one sprocket 50 in tape feeder 34 is provided to the predetermined component transfer position L side of the tape feeder 34 main body. However, the present disclosure is not limited to this, and sprocket 50 of tape feeder 34 may be provided with two sprockets, that is, sprocket 50*a* disposed on the predetermined component transfer position L side of the tape feeder 34 main body and sprocket 50*b* disposed on the tape insertion port 46 side, as shown in FIG. 8. As shown in FIG. 8, two electric motors 52*a*, 52*b* may be provided corresponding to the two sprockets 50*a*, 50*b*, or only one electric motor 52 may simultaneously drive both sprockets 50*a*, 50*b* to rotate.

In this modification, if sensor 200 capable of detecting carrier tape 44 is disposed in the vicinity of the engagement point, on the tape insertion port 46 side with respect to the engagement point between sprocket 50*b* disposed on the tape insertion port 46 side and carrier tape 44, and the presence or absence of carrier tape is detected using sensor 200, the detection result of sensor 200 changes from the tape being present to the tape being absent when carrier tape 44 is disengaged from sprocket 50*b*. Therefore, if the reversing of carrier tape 44 in the opposite direction is stopped when this change occurs, the engagement between carrier tape 44 and both sprockets 50*a*, 50*b* of tape feeder 34 can be reliably released without rotating electric motor 52 unnecessarily. Further, since carrier tape 44 is pulled out from tape insertion port 46 of tape feeder 34 by its own weight or the like without any work by the operator, the work of the operator is further simplified by removing reel 32 from tape feeder 34.

In the above-described embodiment, server 70 includes scheduled use determination section 70*b* for determining whether there is a plan to use component 30 corresponding to tape feeder 34 mounted on loading table 36 installed in setup station 76. However, the present disclosure is not limited to this, and PC 72 provided in setup station 76 may include a scheduled use determination section that determines whether component 30 corresponding to tape feeder 34 is scheduled to be used after obtaining information related to loading table 36 through communication with server 70.

Further, in the above-described embodiment, in the external set-up area where loading table 36 is removed from the component mounting machine 12, PC 72 provided in setup station 76 controls electric motor 52 of tape feeder 34 to reverse carrier tape 44 in the opposite direction. However, the present disclosure is not limited to this, and the control section of component mounting machine 12, with loading table 36 mounted on component mounting machine 12, may reverse carrier tape 44 in the opposite direction by controlling electric motor 52 of tape feeder 34 based on a determination result of the scheduled use determination section on the server 70 side, server 70 may reverse the carrier tape 44 in the opposite direction by controlling electric motor 52 of tape feeder 34 based on the determination result of the scheduled use determination section, or feeder control section 94 of each tape feeder 34 may control electric motor 52 of tape feeder 34 based on the determination result of the scheduled use determination section on the server 70 side, thereby reversing carrier tape 44 in the opposite direction.

Further, in the above embodiment, tape feeder set-up system 10 is configured such that loading table 36 having slots 40 for holding tape feeders 34 and setup station 76 installed in the external set-up area are separately formed. However, the present disclosure is not limited to this, and tape feeder set-up system 10 may have a tape attaching/detaching device configured to combine the function of loading table 36 and the function of setup station 76.

It should be noted that the present disclosure is not limited to the above-described embodiments and alternative embodiments, and various modifications can be made without departing from the spirit and scope of the present disclosure.

REFERENCE SIGNS LIST

10: Tape feeder set-up system, 12: Component mounting machine, 16: Component supply section, 20: Board, 30: Component, 32: Reel, 34: Tape feeder, 36: Loading table, 38: Feeder holding section, 40: Slot, 42: Reel holding shaft, 44: Carrier tape, 46: Tape insertion port, 50: Sprocket, 52: Electric motor, 70: Server, 70*a*: Memory section, 70*b*: Scheduled use determination section, 70*c*: Cancellation section, 72: PC, 72*a*: Operation section, 72*b*: Display section, 72*c*: Control section, 76: Setup station, 82: Control box, 94: Feeder control section.

The invention claimed is:

1. A tape feeder set-up system, comprising:
a tape feeder having a driving mechanism configured to rotate a sprocket to feed a carrier tape wound on a reel and accommodating multiple components in a predetermined feed direction, the sprocket having teeth that engage with sprocket holes of the carrier tape;
a loading table on which the tape feeder is loaded;
a scheduled use determination section configured to determine whether a component in the tape feeder loaded on the loading table is scheduled to be used based on a component usage schedule, and
a control section configured to reverse the carrier tape in a direction opposite to the predetermined feed direction such that an engagement between the sprocket holes of the carrier tape and the teeth of the sprocket is released by controlling the driving mechanism of the tape feeder when the scheduled use determination section determines that the component is not scheduled to be used.

2. The tape feeder set-up system of claim 1, wherein the control section reverses the carrier tape in the opposite direction when a predetermined start operation is performed after the scheduled use determination section determined that the tape feeder is not scheduled to be used.

3. The tape feeder set-up system of claim 2, wherein the tape feeder set-up system further comprises a display section configured to display a request to an operator for an operation for starting a reverse of the carrier tape in the opposite direction when the scheduled use determination section determines that the tape feeder is not scheduled to be used.

4. The tape feeder set-up system of claim 1, wherein the control section reverses the carrier tape in the opposite direction by a predetermined amount.

5. The tape feeder set-up system of claim 1, wherein the control section reverses the carrier tape in the opposite direction until a leading end of the carrier tape goes back to a predetermined position within the tape feeder.

6. The tape feeder set-up system of claim 1, wherein the tape feeder set-up system further comprises:
  a memory section configured to store and link an ID of the tape feeder and an ID of the reel from which the carrier tape is fed by the tape feeder in order to mount components onto boards with a component mounting machine, and
  a cancellation section configured to cancel the link between the ID of the tape feeder and the ID of the reel stored in the memory section when the control section reverses the carrier tape in the opposite direction.

7. The tape feeder set-up system of claim 6,
  wherein the loading table is detachable from the component mounting machine, and
  wherein the control section reverses the carrier tape in the opposite direction with the loading table in a state detached from the component mounting machine.

8. The tape feeder set-up system of claim 1, wherein the tape feeder set-up system further comprises:
  a server for storing a usage schedule for the component, and
  a computer communicatively connected to the server and communicatively connected to the driving mechanism of the tape feeder loaded on the loading table via a signal repeater, and
  wherein the control section is provided in the computer.

9. A tape feeder set-up system, comprising:
  a tape feeder having a driving mechanism configured to rotate a sprocket to feed a carrier tape wound on a reel and accommodating multiple components in a predetermined feed direction the sprocket having teeth that engage with sprocket holes of the carrier tape;
  a control section configured to reverse the carrier tape in a direction opposite to the predetermined feed direction by controlling the driving mechanism;
  a memory section configured to store an ID of the tape feeder linked with an ID of a reel from which the carrier tape is fed by the tape feeder in order to mount a component on a board by a component mounting machine, and
  a cancellation section configured to cancel the link between the ID of the tape feeder stored in the memory section and the ID of the reel when the control section reverses the carrier tape in the opposite direction and an engagement between the sprocket holes of the carrier tape and the teeth of the sprocket is released.

\* \* \* \* \*